US009893708B2

(12) United States Patent
Ishizuka

(10) Patent No.: US 9,893,708 B2
(45) Date of Patent: Feb. 13, 2018

(54) IMPEDANCE CONVERSION RATIO SETTING METHOD, IMPEDANCE CONVERSION CIRCUIT, AND COMMUNICATION TERMINAL APPARATUS

(71) Applicant: Murata Manufacturing Co., Ltd., Nagaokakyo-shi, Kyoto-fu (JP)

(72) Inventor: Kenichi Ishizuka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/142,137

(22) Filed: Apr. 29, 2016

(65) Prior Publication Data

US 2016/0248397 A1     Aug. 25, 2016

Related U.S. Application Data

(63) Continuation of application No. PCT/JP2014/078690, filed on Oct. 29, 2014.

(30) Foreign Application Priority Data

Nov. 5, 2013   (JP) ................................ 2013-228965

(51) Int. Cl.
    *H01Q 1/50*        (2006.01)
    *H03H 7/38*        (2006.01)
    (Continued)

(52) U.S. Cl.
    CPC ........... *H03H 7/38* (2013.01); *H01F 27/2804* (2013.01); *H01F 27/29* (2013.01); *H01F 41/041* (2013.01);
    (Continued)

(58) Field of Classification Search
    CPC ................................. H01Q 1/50; H03H 7/38
    See application file for complete search history.

(56) References Cited

U.S. PATENT DOCUMENTS 5,655,287 A * 8/1997 Ushiro ................ H01F 27/2804
                                                     29/412
6,154,114 A * 11/2000 Takahashi ............. H01F 27/292
                                                     336/200
(Continued)

FOREIGN PATENT DOCUMENTS

JP        04-206905 A     7/1992
JP        08-316054 A    11/1996
(Continued)

OTHER PUBLICATIONS

Official Communication issued in International Patent Application No. PCT/JP2014/078690, dated Feb. 3, 2015.

*Primary Examiner* — Huedung Mancuso
(74) *Attorney, Agent, or Firm* — Keating & Bennett, LLP

(57) ABSTRACT

Coil openings of a primary side coil element of a first transformer, a secondary side coil element of the first transformer, a primary side coil element of a second transformer, and a secondary side coil element of the second transformer overlap with one another when viewed from above in a lamination direction. The primary side coil element of the first transformer and the primary side coil element of the second transformer are connected in parallel, and the secondary side coil element of the first transformer and the secondary side coil element of the second transformer are connected in parallel. An impedance conversion ratio is defined in accordance with a lamination order of the primary side coil element and the secondary side coil element of the first transformer with respect to a lamination order of the primary side coil element and the secondary side coil element of the second transformer within a multilayer body.

12 Claims, 6 Drawing Sheets

(51) Int. Cl.
*H01F 27/28* (2006.01)
*H01F 27/29* (2006.01)
*H01F 41/04* (2006.01)

(52) U.S. Cl.
CPC ....... *H01Q 1/50* (2013.01); *H01F 2027/2809* (2013.01)

(56) References Cited

U.S. PATENT DOCUMENTS

| | | | |
|---|---|---|---|
| 6,541,968 B1* | 4/2003 | Tokuda | G01R 33/028 324/258 |
| 6,675,462 B1* | 1/2004 | Takahashi | H01F 17/0013 29/602.1 |
| 7,205,650 B2* | 4/2007 | Yoshikawa | H01L 21/4857 257/668 |
| 7,375,608 B2* | 5/2008 | Suzuki | H01F 17/0013 336/200 |
| 2007/0109827 A1* | 5/2007 | DelaCruz | H02M 5/08 363/131 |
| 2012/0139814 A1 | 6/2012 | Ishizuka et al. | |
| 2013/0154783 A1* | 6/2013 | Kato | H01F 27/2804 336/200 |

FOREIGN PATENT DOCUMENTS

| | | |
|---|---|---|
| JP | 4761009 B1 | 8/2011 |
| JP | 2012-227352 A | 11/2012 |
| JP | 2013-168892 A | 8/2013 |

\* cited by examiner

IMPEDANCE CONVERSION RATIO SETTING METHOD, IMPEDANCE CONVERSION CIRCUIT, AND COMMUNICATION TERMINAL APPARATUS

BACKGROUND OF THE INVENTION

1. Field of the Invention

The present invention relates to impedance conversion ratio setting methods for impedance conversion circuits that are applied to antenna devices or the like, the impedance conversion circuits, and communication terminal apparatuses including the impedance conversion circuits.

2. Description of the Related Art

As wireless communication apparatuses such as cellular phone terminals and the like become compact, antennas are miniaturized and impedance thereof tends to be lower. Accordingly, in the case where matching is attempted, using a reactance element, on a feeder circuit and an antenna having an extremely lower impedance than the feeder circuit, an available band is undesirably narrowed.

Meanwhile, it is frequently carried out to make a single antenna correspond to a plurality of communication systems. In the case where a single antenna corresponds to a communication system of a low band (for example, 800 MHz band) and a high band (for example, 2 GHz band), a fundamental resonant mode and a high-order resonant mode of a single radiation element are used. However, because impedance of a radiation element differs depending on frequencies, there arises a problem that, when a matching circuit with which matching is successfully carried out at one frequency band is provided, matching cannot be successfully carried out at the other frequency.

In order to solve the above problem, an impedance conversion circuit using a transformer circuit in a matching circuit is proposed, as disclosed in Japanese Patent No. 4761009.

Since an antenna and an impedance conversion circuit are required to be compact, inductance of a primary coil and a secondary coil constituting a transformer of the impedance conversion circuit is extremely small so as to be several nH. This causes problems that magnetic flux is not concentrated because a sufficient number of coil turns cannot be obtained and that an effective value of a coupling coefficient is small because a ratio of inductance generated at an input/output portion of the transformer to the total inductance becomes large.

In order for even a small coil to obtain a predetermined (large) coupling coefficient, it is effective to make the shapes of the primary coil and the secondary coil be the same (almost congruent shape) and dispose the primary and secondary coils so that they overlap with each other.

However, in the case where the primary coil and the secondary coils are made to have the same shape, a degree of freedom to define each inductance of the primary coil and the secondary coil is hardly provided. An impedance conversion ratio is defined in accordance with the inductance of the primary coil and the secondary coil of the transformer. Therefore, it is extremely difficult to obtain a predetermined impedance ratio because of the above-mentioned reason.

SUMMARY OF THE INVENTION

Preferred embodiments of the present invention provide an impedance conversion ratio setting method that defines a predetermined impedance conversion ratio, an impedance conversion circuit, and a communication terminal apparatus including the impedance conversion circuit, so as to solve the above-mentioned problem while maintaining a high coupling coefficient regardless of the impedance conversion circuit being small in size.

An impedance conversion ratio setting method according to a preferred embodiment of the present invention is an impedance conversion ratio setting method for an impedance conversion circuit that includes, in a multilayer body including a plurality of base material layers laminated in a lamination direction, a first transformer including a primary side coil element and a secondary side coil element being coupled to each other through an electromagnetic field and a second transformer including a primary side coil element and a secondary side coil element being coupled to each other through an electromagnetic field, the method including forming coil openings of the primary side coil element of the first transformer, the secondary side coil element of the first transformer, the primary side coil element of the second transformer, and the secondary side coil element of the second transformer overlap with one another when viewed from above in the lamination direction; connecting the primary side coil element of the first transformer and the primary side coil element of the second transformer in parallel, and connecting the secondary side coil element of the first transformer and the secondary side coil element of the second transformer in parallel; and defining an impedance conversion ratio realized by the first transformer and the second transformer in accordance with a lamination order of the primary side coil element of the first transformer and the secondary side coil element of the first transformer as well as a lamination order of the primary side coil element of the second transformer and the secondary side coil element of the second transformer within the multilayer body.

An impedance conversion circuit according to a preferred embodiment of the present invention includes, in a multilayer body including a plurality of base material layers laminated in a lamination direction, a first transformer including a primary side coil element and a secondary side coil element being coupled to each other through an electromagnetic field and a second transformer including a primary side coil element and a secondary side coil element being coupled to each other through an electromagnetic field; coil openings of the primary side coil element of the first transformer, the secondary side coil element of the first transformer, the primary side coil element of the second transformer, and the secondary side coil element of the second transformer overlap with one another when viewed from above in the lamination direction; the primary side coil element of the first transformer and the primary side coil element of the second transformer are connected in parallel, and the secondary side coil element of the first transformer and the secondary side coil element of the second transformer are connected in parallel; the primary side coil element of the first transformer and the secondary side coil element of the first transformer are adjacent to each other in the lamination direction within the multilayer body; and the primary side coil element of the second transformer and the secondary side coil element of the second transformer are adjacent to each other in the lamination direction within the multilayer body.

In an impedance conversion circuit according to a preferred embodiment of the present invention, a lamination order of the primary side coil element of the first transformer and the secondary side coil element of the first transformer within the multilayer body is the same as a lamination order of the primary side coil element of the second transformer and the secondary side coil element of the second transformer within the multilayer body.

In an impedance conversion circuit according to a preferred embodiment of the present invention, a lamination order of the primary side coil element of the first transformer and the secondary side coil element of the first transformer within the multilayer body is the reverse of a lamination order of the primary side coil element of the second transformer and the secondary side coil element of the second transformer within the multilayer body.

An impedance conversion circuit according to a preferred embodiment of the present invention further includes a feeder terminal, an antenna terminal, and a ground terminal, the feeder terminal is connected to a first end of the primary side coil element of the first transformer and a first end of the primary side coil element of the second transformer, the antenna terminal is connected to a second end of the primary side coil element of the first transformer, a second end of the primary side coil element of the second transformer, a first end of the secondary side coil element of the first transformer, and a first end of the secondary side coil element of the second transformer, and the ground terminal is connected to a second end of the secondary side coil element of the first transformer and a second end of the secondary side coil element of the second transformer.

A communication terminal apparatus according to a preferred embodiment of the present invention includes an antenna that transmits/receives a high frequency signal and a feeder circuit for the antenna, and also includes the above-mentioned impedance conversion circuit between the feeder circuit and the antenna.

According to the impedance conversion ratio setting method and the impedance conversion circuit, a predetermined impedance conversion ratio is able to be defined while maintaining a high coupling coefficient regardless of the impedance conversion circuit being small in size. Moreover, a communication terminal apparatus including the impedance conversion circuit with a predetermined impedance conversion ratio is able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
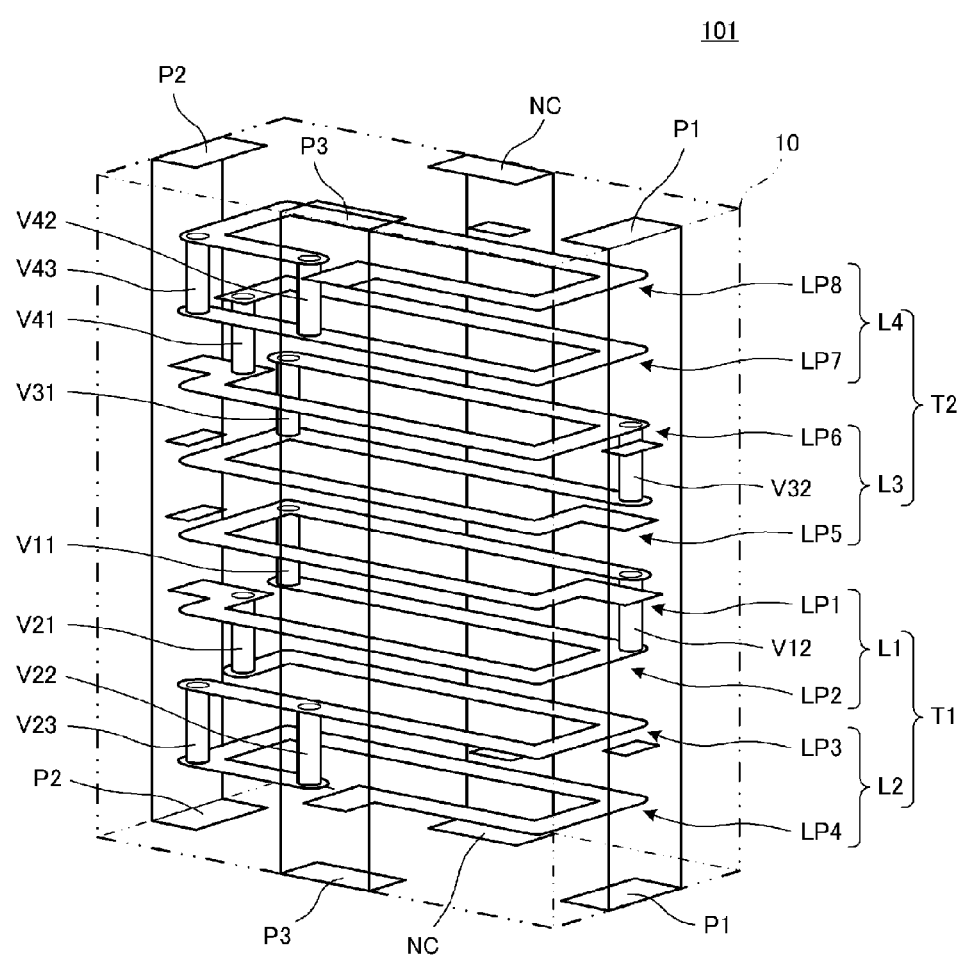
FIG. 1 is a see-through perspective view of the interior of an impedance conversion circuit 101 according to a first preferred embodiment of the present invention.

Hereinafter, a plurality of preferred embodiments of the present invention will be described while citing specific examples with reference to the drawings. In the drawings, identical constituent elements are assigned the same reference sign. The preferred embodiments are merely examples and other configurations described in different preferred embodiments can be partly replaced or combined.

First Preferred Embodiment

FIG. 1 is a see-through perspective view of the interior of an impedance conversion circuit 101 according to a first preferred embodiment of the present invention. Note that dielectric base material layers on which conductor patterns are provided are omitted in the perspective view shown in FIG. 1. Further, in order to facilitate understanding of the lamination structure, dimensions in the lamination directions are exaggerated in the drawing. An example of actual dimensions is as follows. That is, a mounting surface is about 1.6×0.8 mm and a height is about 0.6 mm, for example.

As shown in FIG. 1, eight coil conductors LP1 through LP8 are provided within a multilayer body 10. The coil conductors LP1 through LP8 are respectively interlayer-connected at predetermined positions through vias V11, V12, V21, V22, V23, V31, V32, V41, V42, V43, and the like.

On outer surfaces of the multilayer body 10, a feeder terminal P1, an antenna terminal P2, a ground terminal P3, and a spare terminal NC are respectively provided to define and function as external terminals. Specifically, the feeder terminal P1 is located on a first side surface of the multilayer body 10 and the antenna terminal P2 is located on a second side surface thereof which opposes the first side surface. The ground terminal P3 is located on a third side surface and the spare terminal NC is located on a fourth side surface which opposes the third side surface. On a lower surface and an upper surface of the multilayer body 10, there are provided the feeder terminal P1, the antenna terminal P2, the ground terminal P3, and the spare terminal NC respectively connected to the corresponding external terminals on the above-mentioned side surfaces.

Figure 2:
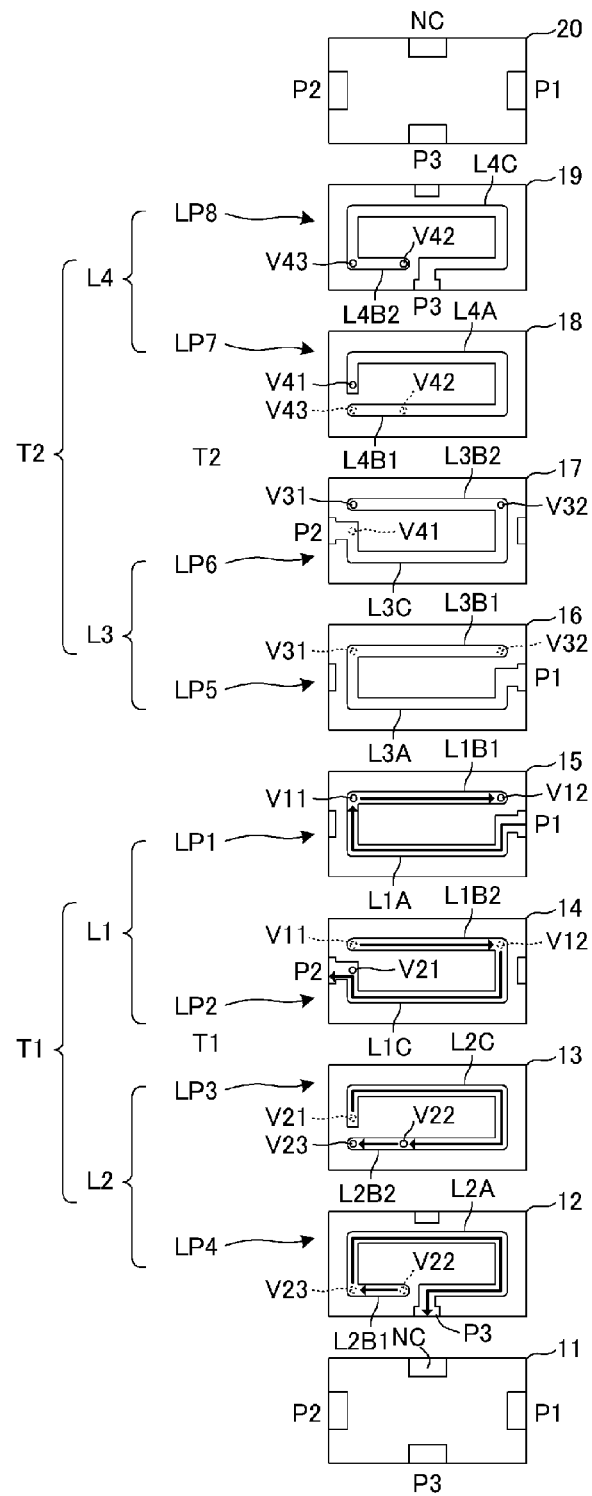
FIG. 2 is a diagram illustrating conductor patterns formed in respective base material layers of the impedance conversion circuit 101 and current paths therein.

FIG. 2 is a diagram illustrating conductor patterns provided on base material layers of the impedance conversion circuit 101 and current paths therein. There are provided a first coil conductor LP1 on a base material layer 15, a second coil conductor LP2 on a base material layer 14, a third coil conductor LP3 on a base material layer 13, and a fourth coil conductor LP4 on a base material layer 12, respectively. Further, there are provided a fifth coil conductor LP5 on a base material layer 16, a sixth coil conductor LP6 on a base material layer 17, a seventh coil conductor LP7 on a base material layer 18, and an eighth coil conductor LP8 on a base material layer 19, respectively.

The coil conductors LP1 and LP2 define a portion of a primary side coil element L1. The coil conductors LP3 and LP4 define a portion of a secondary side coil element L2. The primary side coil element L1 and the secondary side coil element L2 define a first transformer T1, and a primary side coil element L3 and a secondary side coil element L4 define a second transformer T2.

The lamination order of the coil conductors in the first transformer T1 is the reverse of the lamination order of the coil conductors in the second transformer T2 in the lamination direction, so that the first transformer T1 and the second transformer T2 are vertically symmetrical. As such, the first transformer T1 will be mainly described hereinafter.

The first coil conductor LP1 includes conductor patterns L1A and L1B1. An end portion of the conductor pattern L1A is electrically connected to the feeder terminal P1. The second coil conductor LP2 includes conductor patterns L1C and L1B2. The third coil conductor LP3 includes conductor patterns L2B2 and L2C. An end portion of the conductor pattern L2C is electrically connected to the antenna terminal P2. The fourth coil conductor LP4 includes conductor patterns L2A and L2B1. An end portion of the conductor pattern L2A is electrically connected to the ground terminal P3.

The conductor pattern L1B1 which is a portion of the first coil conductor LP1 and the conductor pattern L1B2 which is a portion of the second coil conductor LP2 are connected in parallel through the vias V11 and V12. An end portion of the conductor pattern L1C is connected to the conductor pattern L2C in series through the via V21. The conductor pattern L2B2 which is a portion of the third coil conductor LP3 and the conductor pattern L2B1 which is a portion of the fourth coil conductor LP4 are connected in parallel through the vias V22 and V23.

As shown in FIGS. 1 and 2, each of the coil conductors LP1 through LP8 of the impedance conversion circuit 101 of the present preferred embodiment substantially defines a one-turn coil.

A coil opening defined by the first coil conductor LP1 and a coil opening defined by the second coil conductor LP2 overlap with each other when viewed from above in the lamination direction of the multilayer body. A coil opening defined by the third coil conductor LP3 and a coil opening defined by the fourth coil conductor LP4 overlap with each other when viewed from above in the lamination direction of the multilayer body. Further, the coil openings of the coil conductors respectively defined by the coil conductors LP1 through LP4 overlap with one another when viewed from above in the lamination direction of the multilayer body.

Likewise, as for the coil conductors LP5 through LP8, coil openings defined by the stated coil conductors overlap with one another when viewed from above in the lamination direction of the multilayer body. Moreover, as for the coil conductors LP1 through LP8 as a whole, the coil openings defined by the stated coil conductors overlap with one another when viewed from above in the lamination direction of the multilayer body.

In FIG. 2, a current flows in the first coil conductor LP1 and the second coil conductor LP2 through a path including the feeder terminal P1, the conductor pattern L1A, the conductor patterns (L1B1+L1B2), the conductor pattern L1C, and the antenna terminal P2 in sequence. Further, a current flows in the third coil conductor LP3 and the fourth coil conductor LP4 through a path including the antenna terminal P2, the conductor pattern L2C, the conductor patterns (L2B2+L2B1), the conductor pattern L2A, and the ground terminal P3 in sequence.

As discussed above, the structure of the second transformer T2 is the same as that of the first transformer T1 aside from the difference in the lamination order of the coil conductors. Accordingly, the impedance conversion circuit 101 is a circuit in which a primary side coil element (L1) of the first transformer T1 and a primary side coil element (L3) of the second transformer T2 are connected in parallel, and a secondary side coil element (L2) of the first transformer T1 and the secondary side coil element (L4) of the second transformer T2 are connected in parallel.

The base material layers 11 through 20 are layers each made of a dielectric (insulator) or a magnetic material. For example, the multilayer body 10 may be configured in a manner in which dielectric ceramic green sheets are laminated, pressure-bonded, and fired. Alternatively, resin sheets may be pressure-bonded to define the multilayer body 10. In addition, the multilayer body 10 may be configured in a manner in which magnetic ceramic green sheets are laminated, pressure-bonded, and fired. Alternatively, resin sheets in which magnetic filler is dispersed may be pressure-bonded to define the multilayer body 10. Furthermore, only the layers to define and function as the magnetic core may be made of a magnetic material, and the other layers may be made of a dielectric. For example, of the plurality of base material layers, the base material layers 13 through 19 are layers including a magnetic material and the other base material layers are layers of a non-magnetic material.

By providing the coil elements L1 through L4 in the multilayer body including the magnetic material in the manner described above, the degree of coupling between the primary side coil element L1 and the secondary side coil element L2 increases and the degree of coupling between the primary side coil element L3 and the secondary side coil element L4 also increases, such that mutual inductance thereof becomes large. In addition, since each coil conductor length of the coil elements L1 through L4, which is required to obtain a predetermined inductance, is shortened, the impedance conversion circuit 101 becomes more compact.

The multilayer body 10 preferably has a rectangular or substantially rectangular parallelepiped shape, where the feeder terminal P1 and the antenna terminal P2 are disposed at the centers of the two short sides, respectively, and the ground terminal P3 and the spare terminal NC are disposed at the centers of the two long sides, respectively, when viewed from above. As such, the impedance conversion circuit 101 is easily disposed at a position in a signal transmission path between a feeder circuit and an antenna. In particular, in the case where the signal transmission path between the feeder circuit and the antenna is positioned in a coplanar line, the feeder terminal P1 and the antenna terminal P2 are able to be connected to the center conductor while the ground terminal P3 and the spare terminal NC are able to be connected to a ground conductor of the circuit board with ease. That is, it is unnecessary to provide a distribution-wiring pattern or a special land pattern for connecting these terminals, such that the impedance conversion circuit 101 is easily mounted on the circuit board.

Figure 3:
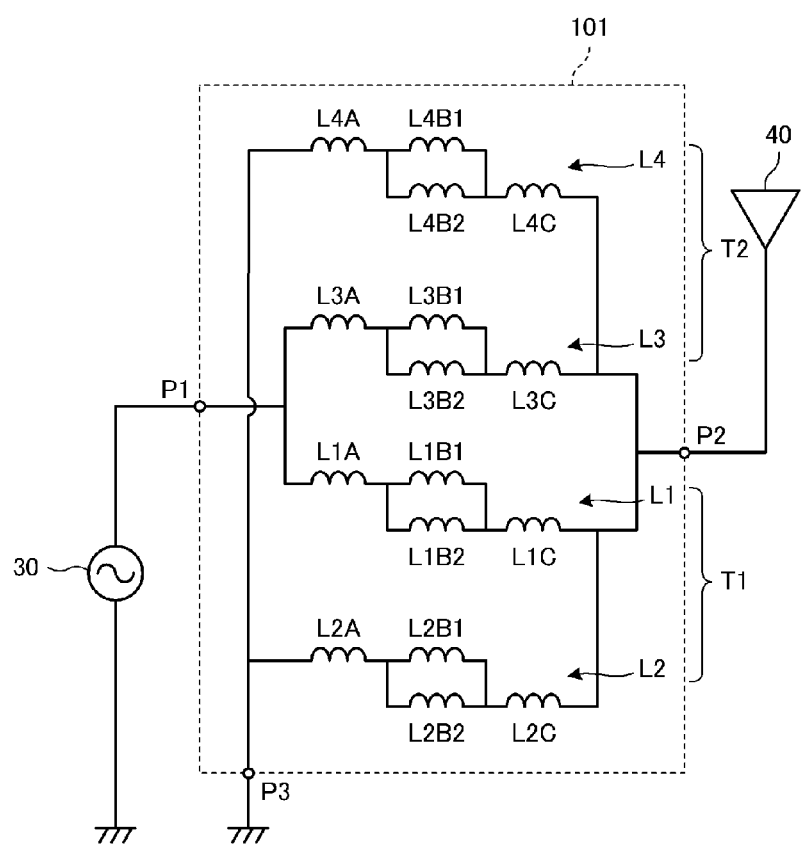
FIG. 3 is a circuit diagram of the impedance conversion circuit 101 shown in FIGS. 1 and 2.

FIG. 3 is a circuit diagram of the impedance conversion circuit 101 shown in FIGS. 1 and 2. A feeder circuit is connected to the feeder terminal P1 of the impedance conversion circuit 101 and an antenna 40 is connected to the antenna terminal P2 thereof. The ground terminal P3 is connected to the ground.

The primary side coil element L1, the secondary side coil element L2, the primary side coil element L3, and the secondary side coil element L4 of the impedance conversion circuit 101 shown in FIGS. 1 and 2 each preferably include four inductors, for example. In the coil elements L1 through L4, lengths of parallel-connection portions (L1B1, L1B2), (L2B1, L2B2), (L3B1, L3B2), and (L4B1, L4B2) are defined by the positions of the vias V11, V12, V22, V23, V31, V32, V42, and V43, respectively.

Here, in the case where inductance of the conductor pattern L1A of the first coil conductor LP1 and inductance of the conductor pattern L1C of the second coil conductor LP2 are respectively represented as L1A and L1C, and inductance of the conductor pattern L1B1 of the first coil conductor LP1 and inductance of the conductor pattern L1B2 of the second coil conductor LP2 are respectively represented as L1B1 and L1B2, inductance L1 of the primary side coil element L1 is expressed by the following formula.

$$L1=L1A+L1C+L1B1 \cdot L1B2/(L1B1+L1B2)$$

As such, because parallel-connection portion inductance L1B1·L1B2/(L1B1+L1B2) and serial-connection portion inductance L1A+L1C are defined not only by the size of the one-turn coil but also by the positions of the vias V11 and V12, combined inductance of the primary side coil element L1 is able to be set to a predetermined value in accordance with the positions of the vias V11 and V12 without changing the coil opening.

Likewise, inductance L2 of the secondary side coil element L2 is expressed by the following formula.

$$L2=L2A+L2C+L2B1 \cdot L2B2/(L2B1+L2B2)$$

As such, because parallel-connection portion inductance L2B1·L2B2/(L2B1+L2B2) and serial-connection portion inductance L2A+L2C are defined not only by the size of the one-turn coil but also by the positions of the vias V22 and V23, combined inductance of the secondary side coil element L2 is able to be set to a predetermined value in accordance with the positions of the vias V22 and V23 without changing the coil opening.

Likewise, combined inductance of the primary side coil element L3 is able to be set to a predetermined value in accordance with the positions of the vias V31 and V32, and combined inductance of the secondary side coil element L4 is able to be set to a predetermined value in accordance with the positions of the vias V42 and V43.

Figure 4A:
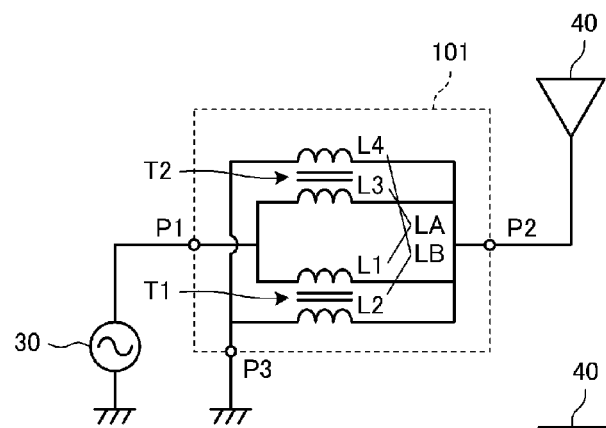
FIG. 4A is a simplified circuit diagram of the impedance conversion circuit 101.
Figure 4B:
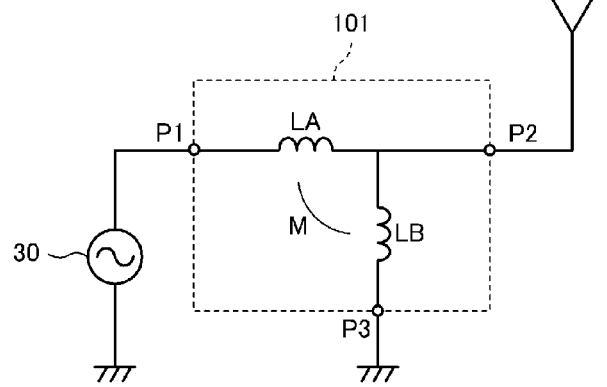
FIG. 4B is a more simplified circuit diagram of the impedance conversion circuit 101.
Figure 4C:
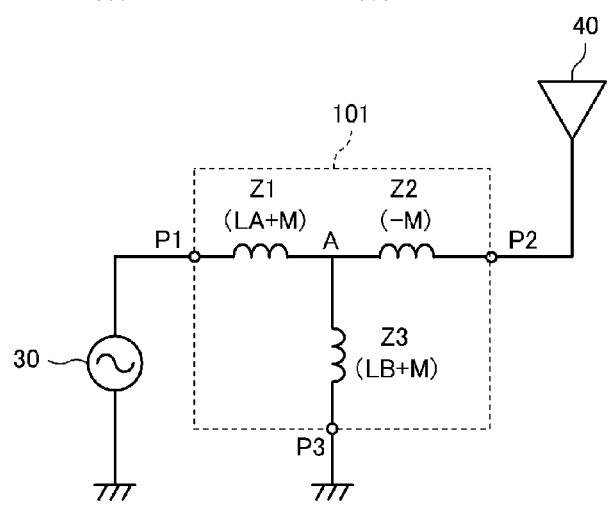
FIG. 4C is an equivalent circuit diagram of the impedance conversion circuit 101.

FIG. 4A is a simplified circuit diagram of the impedance conversion circuit 101. FIG. 4B is a more simplified circuit diagram of the impedance conversion circuit 101. FIG. 4C is an equivalent circuit diagram of the impedance conversion circuit 101.

As shown in FIG. 4A, the primary side coil element (L1) of the first transformer T1 and the primary side coil element (L3) of the second transformer T2 are connected in parallel, and the secondary side coil element (L2) of the first transformer T1 and the secondary side coil element (L4) of the second transformer T2 are connected in parallel.

FIG. 4B is a circuit diagram in which inductors connected in parallel are represented by a single inductor. A primary side coil LA and a secondary side coil LB define an auto-transformer type circuit.

As shown in FIG. 4C, this auto-transformer type circuit is able to be equivalently converted to a T-type circuit including three inductance elements Z1, Z2, and Z3. In other words, the T-type circuit is including the feeder terminal P1 connected to the feeder circuit 30, the antenna terminal P2, the ground terminal P3, the inductance element Z1 connected between the feeder terminal P1 and a branch point A, the inductance element Z2 connected between the antenna terminal P2 and the branch point A, and the inductance element Z3 connected between the ground terminal P3 and the branch point A. In the case where inductance of the primary side coil LA is taken as LA and inductance of the secondary side coil LB is taken as LB, a transformation ratio of the impedance conversion circuit 101 is as follows.

$$((LA+M)+(LB+M)):((-M)+(LB+M))=(LA+LB+2M):LB$$

Figure 5:
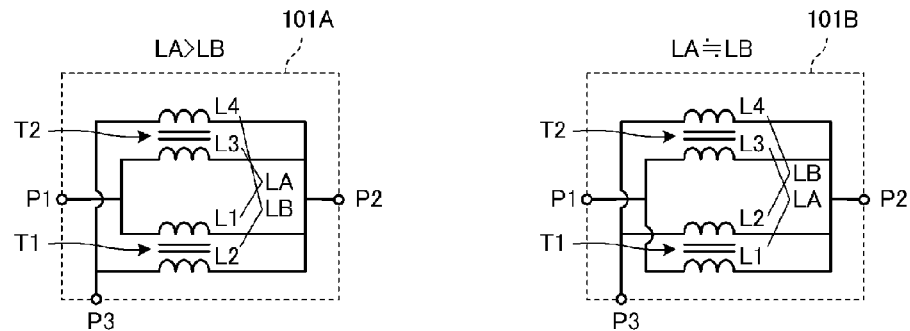
FIG. 5 is a diagram illustrating four examples of impedance conversion circuits, in which a lamination order of a primary side coil element (L1) of a first transformer T1 and a primary side coil element (L3) of a second transformer T2 and a lamination order of a secondary side coil element (L2) of the first transformer T1 and a secondary side coil element (L4) of the second transformer T2 are different.
Figure 5:
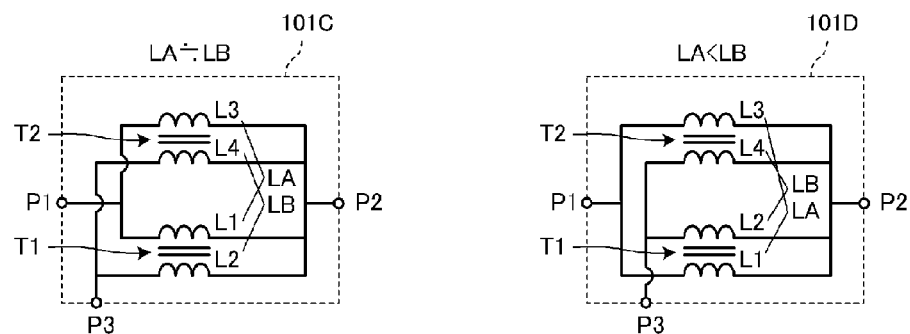

Within the multilayer body 10 shown in FIG. 1, as the lamination order of the primary side coil element (L1) of the first transformer T1 and the primary side coil element (L3) of the second transformer T2 as well as the lamination order of the secondary side coil element (L2) of the first transformer T1 and the secondary side coil element (L4) of the second transformer T2, several lamination orders can be given in addition to those described in FIGS. 1 and 2. FIG. 5 is a diagram illustrating examples of the above-mentioned lamination orders. In FIG. 5, an impedance conversion circuit 101A is the same as the impedance conversion circuit 101 exemplified in FIG. 4A. The primary side coil inductance and the secondary side coil inductance of the first transformer T1 and the second transformer T2 are changed depending on the lamination order of the coil elements L1, L2, L3, and L4.

Figure 6:
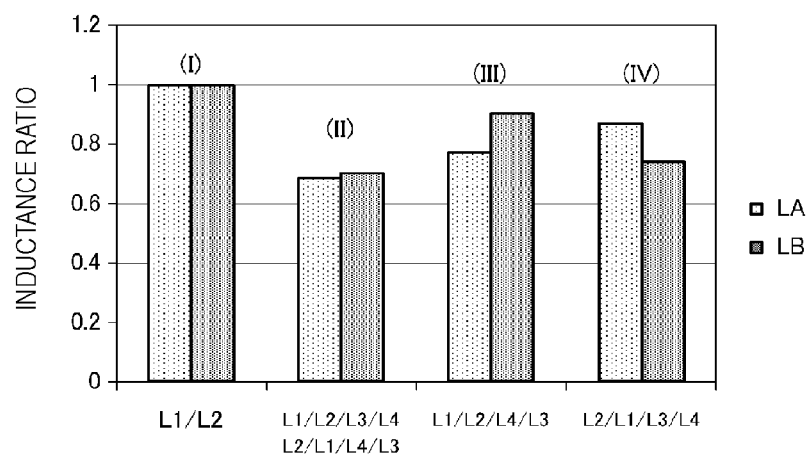
FIG. 6 is a graph illustrating differences in inductance between a primary coil and a secondary coil depending on a lamination order of the coil elements L1, L2, L3, and L4.

FIG. 6 is a graph illustrating differences in inductance between the primary coil and the secondary coil depending on the lamination order of the coil elements L1, L2, L3, and L4. The portions of the graph of FIG. 6 are described below.

(I) represents each inductance of the primary coil and the secondary coil in the case where a one-layer primary coil and a one-layer secondary coil are simply laminated to define a single transformer. The inductance values of this case are taken as the reference values.

(II) represents each inductance of the primary side coil LA and the secondary side coil LB of impedance conversion circuits 101B and 101C in FIG. 5.

(III) represents each inductance of the primary side coil LA and the secondary side coil LB of an impedance conversion circuit 101D in FIG. 5.

(IV) represents each inductance of the primary side coil LA and the secondary side coil LB of the impedance conversion circuit 101A in FIG. 5.

Like the impedance conversion circuit 101A shown in FIG. 5, in the case where the primary side coil element (L1) of the first transformer T1 and the primary side coil element (L3) of the second transformer T2 are adjacent to each other in the lamination direction, and the secondary side coil element (L2) of the first transformer T1 and the secondary side coil element (L4) of the second transformer T2 sandwich the above-described two coil elements therebetween, the coil elements L1 and L3 being sandwiched come close to each other. Because of this, the inductance of the primary side coil LA realized by the coil elements L1 and L3 is larger than the inductance of the secondary side coil LB realized by the coil elements L2 and L4 sandwiching the coil elements L1 and L3.

Conversely, like the impedance conversion circuit 101D, in the case where the secondary side coil element (L2) of the first transformer T1 and the secondary side coil element (L4) of the second transformer T2 are adjacent to each other in the lamination direction, and the primary side coil element (L1) of the first transformer T1 and the primary side coil element (L3) of the second transformer T2 are so disposed as to sandwich the two coil elements therebetween, the coil elements L2 and L4 being sandwiched come close to each other. Because of this, the inductance of the secondary side coil LB realized by the coil elements L2 and L4 is larger than the inductance of the primary side coil LA realized by the coil elements L1 and L3 sandwiching the coil elements L2 and L4.

Further, like the impedance conversion circuit 101B, in the case where the secondary side coil element (L2) of the first transformer T1 and the primary side coil element (L3) of the second transformer T2 are adjacent to each other in the lamination direction, and the primary side coil element (L1) of the first transformer T1 and the secondary side coil element (L4) of the second transformer T2 are so disposed as to sandwich the two coil elements therebetween, the inductance of the primary side coil LA and the inductance of the secondary side coil LB are both small, and are also equal or approximately equal to each other.

Likewise, like the impedance conversion circuit 101C, in the case where the primary side coil (L1) of the first transformer T1 and the secondary side coil element (L4) of the second transformer T2 are adjacent to each other in the lamination direction, and the secondary side coil element (L2) of the first transformer T1 and the primary side coil element (L3) of the second transformer T2 are so disposed as to sandwich the two coil elements therebetween, the inductance of the primary side coil LA and the inductance of the secondary side coil LB are both small, and are also equal or approximately equal to each other.

As discussed above, a magnitude relation between the inductance of the primary side coil LA and the inductance of the secondary side coil LB is able to be defined depending on whether or not the lamination order of the primary side coil element L1 of the first transformer T1 and the secondary side coil element L2 of the first transformer T1 is equal to the lamination order of the primary side coil element L3 of the second transformer T2 and the secondary side coil element L4 of the second transformer T2 within the multilayer body.

As such, an impedance conversion ratio realized by the first transformer T1 and the second transformer T2 is able to be defined by the lamination order of the primary side coil L1 of the first transformer T1 and the primary side coil element L3 of the second transformer T2 and the lamination order of the secondary side coil element L2 of the first transformer T1 and the secondary side coil element L4 of the second transformer T2 within the multilayer body 10.

As shown in FIGS. 4B and 4C, since the transformation ratio of the impedance conversion circuit 101 is (LA+LB+2M):LB, using the impedance conversion circuit 101A having a relation of LA>LB can cause the impedance conversion ratio to be larger. In contrast, using the impedance conversion circuit 101D having a relation of LA<LB can cause the impedance conversion ratio to be small. Using the impedance conversion circuit 101B or 101C, having a relation of LA≈LB, can set the impedance conversion ratio to a value between the above conversion ratio values.

In addition to the above-discussed advantageous effects, preferred embodiments of the present invention exhibit the following advantageous effects.

Because the coil openings of the plurality of coil conductors LP1 through LP8 overlap with one another when viewed from above in the lamination direction, a high level of electromagnetic field coupling is obtained between the primary side coil and the secondary side coil of the first transformer T1 and the second transformer T2.

Because two vias that partly connect conductor patterns in parallel are provided in the positions where the conductor patterns are located, additional areas for forming the vias are unnecessary, and thus it is unnecessary to form wiring outside the formation area of the coil conductors. This makes it possible to form loop-shaped coil conductors in a limited area and make the circuit compact.

Although it is preferable for the coil openings defined by the plurality of coil conductors LP1 through LP8 to wholly overlap with one another when viewed from above in the lamination direction of the multilayer body, a portion of the coil openings may not be overlapped.

In FIGS. 1 and 2, an example is given in which the lamination order of the coil conductors in the first transformer T1 is the reverse of the lamination order of the coil conductors in the second transformer T2 so that the first transformer T1 and the second transformer T2 are vertically symmetrical. However, the coil conductors in the first transformer T1 and the coil conductors in the second transformer T2 may be vertically asymmetrical. For example, among the laminated four coil elements, inductance of the first layer coil element and the fourth layer coil element (the coil element L2 and the coil element L4 in the example shown in FIGS. 1 and 2) may differ from each other. Further, inductance of the second layer coil element and the third layer coil element (the primary side coil element L1 and the primary side coil element L3 in the example shown in FIGS. 1 and 2) may differ from each other. Also in these cases, within the multilayer body 10, an impedance conversion ratio realized by the first transformer T1 and the second transformer T2 can be defined by the lamination order of the primary side coil element L1 of the first transformer T1 and the primary side coil element L3 of the second transformer T2 and the lamination order of the secondary side coil element L2 of the first transformer T1 and the secondary side coil element L4 of the second transformer T2.

Second Preferred Embodiment

Figure 7:
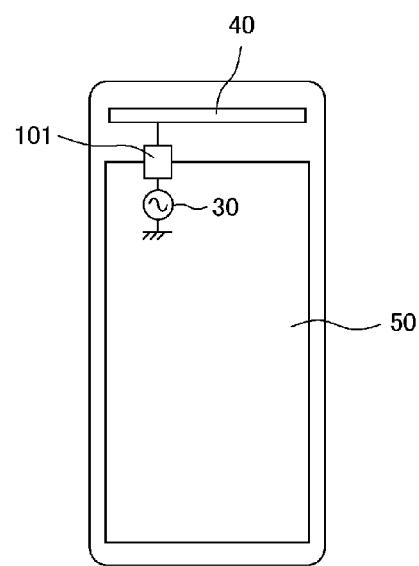
FIG. 7 is a diagram illustrating a configuration of a communication terminal apparatus, such as a cellular phone terminal and the like, according to a second preferred embodiment of the present invention.

FIG. 7 is a diagram illustrating a configuration of a communication terminal apparatus, such as a cellular phone terminal and the like, according to a second preferred embodiment of the present invention. FIG. 7 illustrates a main portion inside a housing of the stated communication terminal apparatus. The antenna 40 and a circuit board are provided inside the housing. A ground conductor 50, the impedance conversion circuit 101, and the feeder circuit 30 are mounted in the circuit board. The antenna 40 is a T-branch type antenna. The ground conductor 50 defines and functions as an image formation conductor of the antenna 40 or defines and functions as a radiation element along with the antenna 40.

The configuration of the impedance conversion circuit 101 is preferably the same as discussed in the first preferred embodiment. The feeder terminal P1 of the impedance conversion circuit 101 is connected to the feeder circuit 30, the antenna terminal P2 of the impedance conversion circuit 101 is connected to the antenna 40, and the ground terminal P3 of the impedance conversion circuit 101 is connected to the ground conductor 50 in the circuit board.

Although the impedance conversion circuit 101 is small in size, it can have a large predetermined impedance conversion ratio. Accordingly, the compact (lower impedance) antenna 40 is able to be provided, such that a compact and low-loss communication terminal apparatus is configured as a whole.

Other Preferred Embodiments

In the first preferred embodiment, although an example in which each coil conductor preferably a rectangular or substantially rectangular loop-shaped configuration is given, the loop-shaped configuration of the coil conductor is not limited thereto. For example, a circle, an ellipse, a quadrangle with the corners being rounded, or a quadrangle with the corner being cut may be used. In the case where a rectangle is used, a coil opening is able to be made large within a limited space. In the case where a circle, an ellipse, or a quadrangle with the corners being rounded is used, loss in the corners is able to be significantly reduced.

In the first preferred embodiment, such an example is given that one parallel-connection portion is defined by connecting two coil conductors provided on the base material layers adjacent to each other using two vias. However, the present invention is not limited to the above configuration. Two or more parallel-connection portions of the first coil conductor and the second coil conductor may be defined by the first coil conductor and the second coil conductor being connected through the vias at three or more positions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An impedance conversion ratio setting method for an impedance conversion circuit that includes, in a multilayer body where a plurality of base material layers are laminated, a first transformer including a primary side coil element and a secondary side coil element being coupled to each other through an electromagnetic field and a second transformer including a primary side coil element and a secondary side coil element being coupled to each other through an electromagnetic field, the method comprising:
    making coil openings of the primary side coil element of the first transformer, the secondary side coil element of the first transformer, the primary side coil element of the second transformer, and the secondary side coil element of the second transformer overlap with one another when viewed from above in a lamination direction;
    making the primary side coil element of the first transformer and the primary side coil element of the second transformer be connected in parallel, and making the secondary side coil element of the first transformer and the secondary side coil element of the second transformer be connected in parallel; and
    defining an impedance conversion ratio realized by the first transformer and the second transformer in accordance with a lamination order of the primary side coil element of the first transformer and the secondary side coil element of the first transformer as well as a lamination order of the primary side coil element of the second transformer and the secondary side coil element of the second transformer within the multilayer body.

2. The method according to claim 1, wherein the primary side coil element of the first transformer and the secondary side coil element of the first transformer are adjacent to each other in the lamination direction within the multilayer body, and the primary side coil element of the second transformer and the secondary side coil element of the second transformer are adjacent to each other in the lamination direction within the multilayer body.

3. The method according to claim 1, wherein a lamination order of the primary side coil element of the first transformer and the secondary side coil element of the first transformer within the multilayer body is the same as a lamination order of the primary side coil element of the second transformer and the secondary side coil element of the second transformer within the multilayer body.

4. The method according to claim 1, wherein a lamination order of the primary side coil element of the first transformer and the secondary side coil element of the first transformer within the multilayer body is the reverse of a lamination order of the primary side coil element of the second transformer and the secondary side coil element of the second transformer within the multilayer body.

5. The method according to claim 1, further comprising:
    providing a feeder terminal, an antenna terminal, and a ground terminal; wherein
    the feeder terminal is connected to a first end of the primary side coil element of the first transformer and a first end of the primary side coil element of the second transformer,
    the antenna terminal is connected to a second end of the primary side coil element of the first transformer, a second end of the primary side coil element of the second transformer, a first end of the secondary side coil element of the first transformer, and a first end of the secondary side coil element of the second transformer, and
    the ground terminal is connected to a second end of the secondary side coil element of the first transformer and a second end of the secondary side coil element of the second transformer.

6. An impedance conversion circuit comprising a feeder terminal, an antenna terminal, a ground terminal, and, in a multilayer body where a plurality of base material layers are laminated, a first transformer including a primary side coil element and a secondary side coil element being coupled to each other through an electromagnetic field and a second transformer including a primary side coil element and a secondary side coil element being coupled to each other through an electromagnetic field,
    wherein coil openings of the primary side coil element of the first transformer, the secondary side coil element of the first transformer, the primary side coil element of the second transformer, and the secondary side coil element of the second transformer overlap with one another when viewed from above in the lamination direction,
    the primary side coil element of the first transformer and the primary side coil element of the second transformer are connected in parallel, and the secondary side coil element of the first transformer and the secondary side coil element of the second transformer are connected in parallel,
    the primary side coil element of the first transformer and the secondary side coil element of the first transformer are adjacent to each other in the lamination direction within the multilayer body,
    the primary side coil element of the second transformer and the secondary side coil element of the second transformer are adjacent to each other in the lamination direction within the multilayer body,
    the feeder terminal is connected to a first end of the primary side coil element of the first transformer and a first end of the primary side coil element of the second transformer,
    the antenna terminal is connected to a second end of the primary side coil element of the first transformer, a second end of the primary side coil element of the second transformer, a first end of the secondary side coil element of the first transformer, and a first end of the secondary side coil element of the second transformer, and the ground terminal is connected to a second end of the secondary side coil element of the first transformer and a second end of the secondary side coil element of the second transformer.

7. The impedance conversion circuit according to claim 6, wherein a lamination order of the primary side coil element of the first transformer and the secondary side coil element of the first transformer within the multilayer body is the same as a lamination order of the primary side coil element of the second transformer and the secondary side coil element of the second transformer within the multilayer body.

8. The impedance conversion circuit according to claim 6, wherein a lamination order of the primary side coil element of the first transformer and the secondary side coil element of the first transformer within the multilayer body is the reverse of a lamination order of the primary side coil element of the second transformer and the secondary side coil element of the second transformer within the multilayer body.

9. A communication terminal apparatus comprising:
an antenna for transmitting/receiving a high frequency signal and a feeder circuit for the antenna; and
an impedance conversion circuit between the feeder circuit and the antenna; wherein
the impedance conversion circuit comprises, in a multilayer body where a plurality of base material layers are laminated, a first transformer including a primary side coil element and a secondary side coil element being coupled to each other through an electromagnetic field and a second transformer including a primary side coil element and a secondary side coil element being coupled to each other through an electromagnetic field,
coil openings of the primary side coil element of the first transformer, the secondary side coil element of the first transformer, the primary side coil element of the second transformer, and the secondary side coil element of the second transformer overlap with one another when viewed from above in the lamination direction,
the primary side coil element of the first transformer and the primary side coil element of the second transformer are connected in parallel, and the secondary side coil element of the first transformer and the secondary side coil element of the second transformer are connected in parallel,
the primary side coil element of the first transformer and the secondary side coil element of the first transformer are adjacent to each other in the lamination direction within the multilayer body, and
the primary side coil element of the second transformer and the secondary side coil element of the second transformer are adjacent to each other in the lamination direction within the multilayer body.

10. The communication terminal apparatus according to claim 9, wherein a lamination order of the primary side coil element of the first transformer and the secondary side coil element of the first transformer within the multilayer body is the same as a lamination order of the primary side coil element of the second transformer and the secondary side coil element of the second transformer within the multilayer body.

11. The communication terminal apparatus according to claim 9, wherein a lamination order of the primary side coil element of the first transformer and the secondary side coil element of the first transformer within the multilayer body is the reverse of a lamination order of the primary side coil element of the second transformer and the secondary side coil element of the second transformer within the multilayer body.

12. The communication terminal apparatus according to claim 9, further comprising:
a feeder terminal, an antenna terminal, and a ground terminal,
wherein the feeder terminal is connected to a first end of the primary side coil element of the first transformer and a first end of the primary side coil element of the second transformer,
the antenna terminal is connected to a second end of the primary side coil element of the first transformer, a second end of the primary side coil element of the second transformer, a first end of the secondary side coil element of the first transformer, and a first end of the secondary side coil element of the second transformer, and
the ground terminal is connected to a second end of the secondary side coil element of the first transformer and a second end of the secondary side coil element of the second transformer.

* * * * *